(12) United States Patent
Nasuno et al.

(10) Patent No.: US 7,176,486 B2
(45) Date of Patent: Feb. 13, 2007

(54) STRUCTURE OF TEST ELEMENT GROUP WIRING AND SEMICONDUCTOR SUBSTRATE

(75) Inventors: Takashi Nasuno, Shizuoka (JP); Hiroshi Tsuda, Kanagawa (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/016,890

(22) Filed: Dec. 21, 2004

(65) Prior Publication Data

US 2005/0139826 A1 Jun. 30, 2005

(30) Foreign Application Priority Data

Dec. 25, 2003 (JP) ............................. 2003-430307

(51) Int. Cl.
*H01L 23/58* (2006.01)
*H01L 29/10* (2006.01)

(52) U.S. Cl. .................... 257/48; 257/758; 438/11; 438/14; 438/15; 438/18

(58) Field of Classification Search ............... 438/18, 438/14, 15, 638; 257/668, 48, 419, 295, 257/758, E21.521–E22.531; 430/5
See application file for complete search history.

(56) References Cited

U.S. PATENT DOCUMENTS 6,492,189 B1 * 12/2002 Yamaguchi ................ 438/18
6,620,557 B1 * 9/2003 Hosono et al. ............. 430/5
6,881,597 B2 * 4/2005 Asayama et al. .......... 438/18
2003/0126582 A1 * 7/2003 Kobayashi et al. ........ 716/21
2003/0230810 A1 * 12/2003 Yokogawa ................ 257/758

FOREIGN PATENT DOCUMENTS

| JP | 2000-115493 | 4/2000 |
|---|---|---|
| JP | 2001-135569 | 5/2001 |
| JP | 2001-209167 | 8/2001 |
| JP | 2001-296646 | 10/2001 |
| JP | 2002-258459 | 9/2002 |
| JP | 2003-158162 | 5/2003 |
| JP | 2003-195473 | 7/2003 |
| JP | 2004-22570 | 1/2004 |

* cited by examiner

*Primary Examiner*—Andy Huynh
*Assistant Examiner*—Tram H. Nguyen
(74) *Attorney, Agent, or Firm*—Leydig, Voit & Mayer, Ltd.

(57) ABSTRACT

A structure of test element group wiring includes, in addition to an electrode on a substrate including one or more layers of insulating films, and real wirings electrically connected to the electrode, includes dummy wirings electrically isolated from the electrode and having a portion of the same shape as the real wiring. The dummy wirings are disposed at a predetermined constant distance, adjacent to the real wirings or to each other, so that the wiring rate of the real wiring relaxes the concentration difference of patterns. The distance between the real wirings is sufficient to perform pattern analysis using the OBIRCH method.

5 Claims, 13 Drawing Sheets

STRUCTURE OF TEST ELEMENT GROUP WIRING AND SEMICONDUCTOR SUBSTRATE

BACKGROUND OF THE INVENTION

1. Field of the Invention

The present invention relates to a structure of TEG wiring and a semiconductor substrate. More specifically, the present invention relates preferably to a structure of test element group (TEG) wiring that can be used in the analysis of the electrical characteristics and the like of semiconductor devices, and a semiconductor substrate that has such a structure of TEG wiring.

2. Background Art

With the high integration and miniaturization of semiconductor devices and the like in recent years, improvement of resolution in photolithography has been demanded. Resolution can be improved by enlarging the numerical aperture of the lens, or by shortening the wavelength of the exposure light. Therefore, the wavelength of exposure light has been shortened. For example, in the 65-nm node an ArF excimer laser is widely used as exposure light. The use of exposure light having a still shorter wavelength, such as $F_2$ excimer laser light having a wavelength of 157.6 nm, has also been examined.

In order to further improve resolution, the method for elevating coherence using off-axis illumination or the like has been frequently used. In this case, however, the problems of the optical proximity effect such as corner rounding wherein a right-angle pattern is rounded, line shortening wherein a line pattern is shortened, line narrowing, and line widening will be significant.

Therefore, as a method for suppressing the optical proximity effect to faithfully transfer the pattern, OPC (optical proximity correction) is essential. In OPC, a method for eliminating pattern density difference, for example, by previously forming a wide mask pattern (bias type) or adding dummy patterns on the circumference of the pattern (feature type) is adopted to cope with pattern narrowing related to pattern density difference. Various OPC methods, such as forming the lines of the mask pattern to be long (extension type or hammer head type) as the countermeasure to line shortening, and adjusting the shape of the pattern-corner portions (outer serif or inner serif) as a countermeasure to corner rounding are also adopted.

However, as patterns are miniaturized or the wiring layout is diversified, the occurrence mode of the optical proximity effect has become complicated. Therefore, more complicated OPC has been required and the necessity for dealing with each pattern, such as the adjustment of the shape of each pattern using simulation model of lithography has increased. However, if OPC dealing with each pattern is used, the long processing time is required. Therefore, in the present stage, a method wherein accurate adjustment using simulation model or the like is performed when the offset value of a significant segment or a significant line is calculated, and the above-described so-called rule-base OPC regularized to some extent is performed for other portions. Therefore, the rule-base OPC is still frequently used.

On the other hand, in addition to the optical proximity effect, the flare of the light causes a problem of the inaccuracy pattern shape in fine exposure. Flare is caused by the scattered light reflected from the fine irregularity of the lens in the exposure apparatus or from the surface of a wafer, and deteriorates the contrast of exposure light. The contrast of exposure light plays an important role in pattern formation, and the deterioration of the contrast causes the problem of inaccuracy of the pattern shape and lowering of the exposure margin. As a measure to suppress flare, the use of a photomask having a flare-correcting region or the like has been proposed.

For defect analysis of semiconductor devices, the OBIRCH method using a TEG (test element group) wiring is frequently used. The OBIRCH method is a method wherein laser beams in the infrared region are radiated onto a wiring, and the defective wiring portion is identified from difference in the wiring resistance rising rate. However, since infrared beams are used in this analysis, point resolution is low. In the present stage, it is considered to be difficult to obtain specifically the resolution of about 3 μm or more. In other words, the analysis of a defect on the current path is difficult unless a space of at least about 3 μm or more exists. Therefore, the TEG wiring used in the OBIRCH method is an isolated wiring having a space between wirings of about 3 μm or more.

However, as miniaturization proceeds, the analysis of a defective fine pattern is required in the defect analysis. Specifically, defect analysis effective to a pattern having a space between wirings of a fine pitch of about 3 μm or less is required. Not only the analysis of such an isolated wiring pattern having a wiring interval of about 3 μm, but also the analysis of dense fine wiring patterns is required.

Furthermore, a wiring layout having a large rate of wiring and a wiring layout having a small rate of wiring are generally present in a mask. As the wiring structure is miniaturized, the variation of the wiring rate increases. It has been known that difference in wiring rate in a mask causes the flare effect, and this is difficult to deal with using only the shape correction of the above-described OPC or the like. Therefore, the data ratio on a mask must be averaged.

SUMMARY OF THE INVENTION

Therefore, the object of the present invention is to provide an improved structure of TEG wiring that can perform defect analysis for a TEG wiring having a fine pattern of a pitch of about 3 μm or less, when the pattern is an isolated wiring pattern, or a dense wiring pattern; and a semiconductor substrate having such a TEG wiring structure.

According to one aspect of the present invention, a structure of TEG wiring comprises a substrate including at least one layer of insulating film, an electrode formed on the substrate, a real wiring electrically conductive to the electrode, and a plurality of dummy wirings electrically isolated from the electrode. The dummy wirings are disposed at constant intervals in vicinity of the real wiring and have a portion of the same shape as the real wiring.

According to another aspect of the present invention, a semiconductor substrate comprises a substrate including at least one layer of insulating film, a scribe line area dividing the substrate into a plurality of chip regions, a plurality of semiconductor chips formed in chip regions divided by the scribe line area, and a TEG wiring formed in an scribe line area. The TEG wiring includes an electrode formed on the substrate, a real wiring electrically conductive to the electrode, and a plurality of dummy wirings electrically isolated from the electrode. The dummy wirings are disposed at constant intervals in vicinity of the real wiring, and have a portion of the same shape as the real wiring.

Other and further objects, features and advantages of the invention will appear more fully from the following description.

DETAILED DESCRIPTION OF THE PREFERRED EMBODIMENTS

Figure 1:
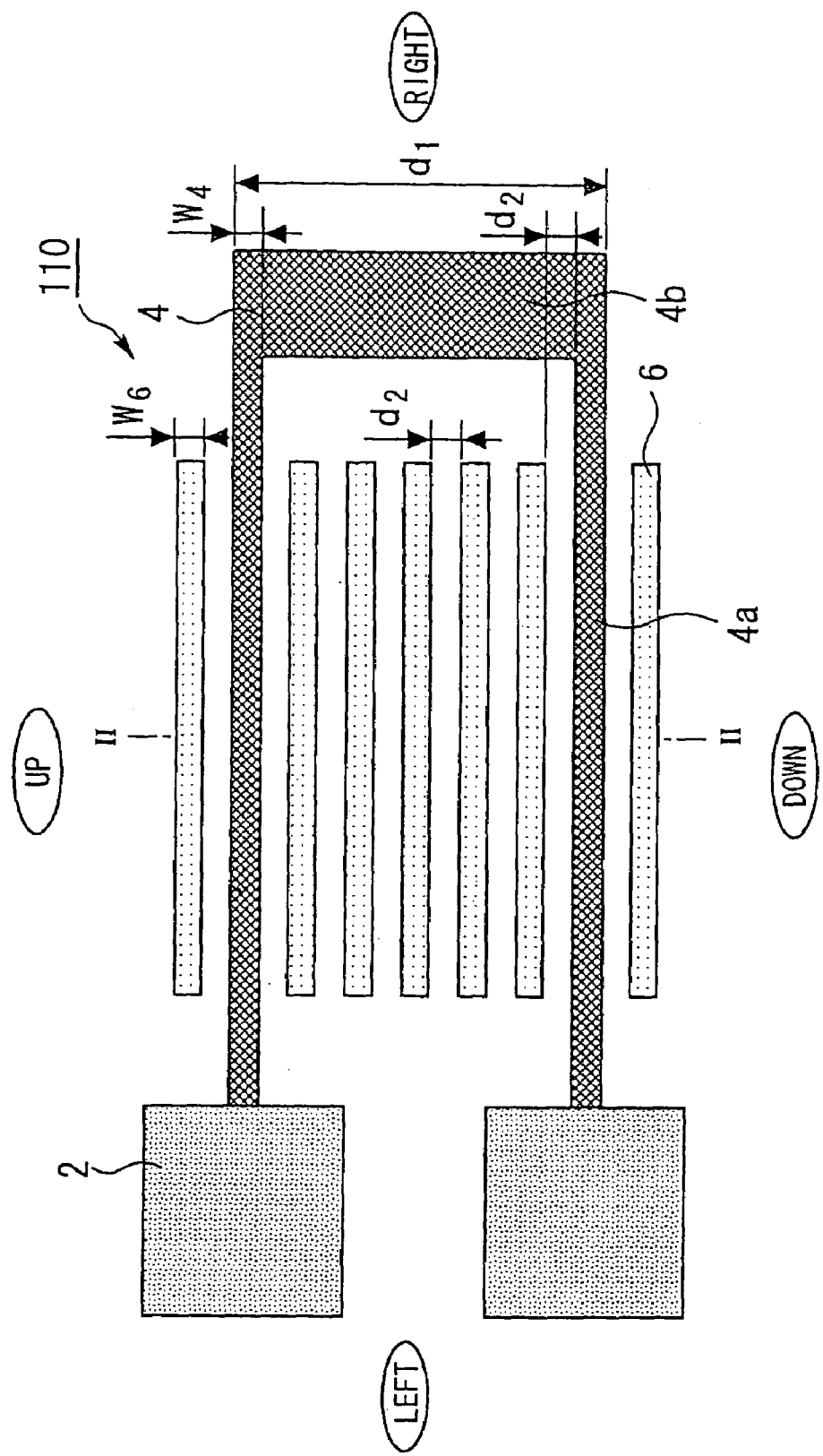
FIGS. 1 and 2 are schematic diagrams for illustrating a structure of TEG wiring according to the first embodiment of the present invention.

The embodiments of the present invention will be described below referring to the drawings. In the drawings, the same or corresponding parts are denoted using the same reference numerals, and the description thereof will be simplified or omitted.

First Embodiment

Figure 2:
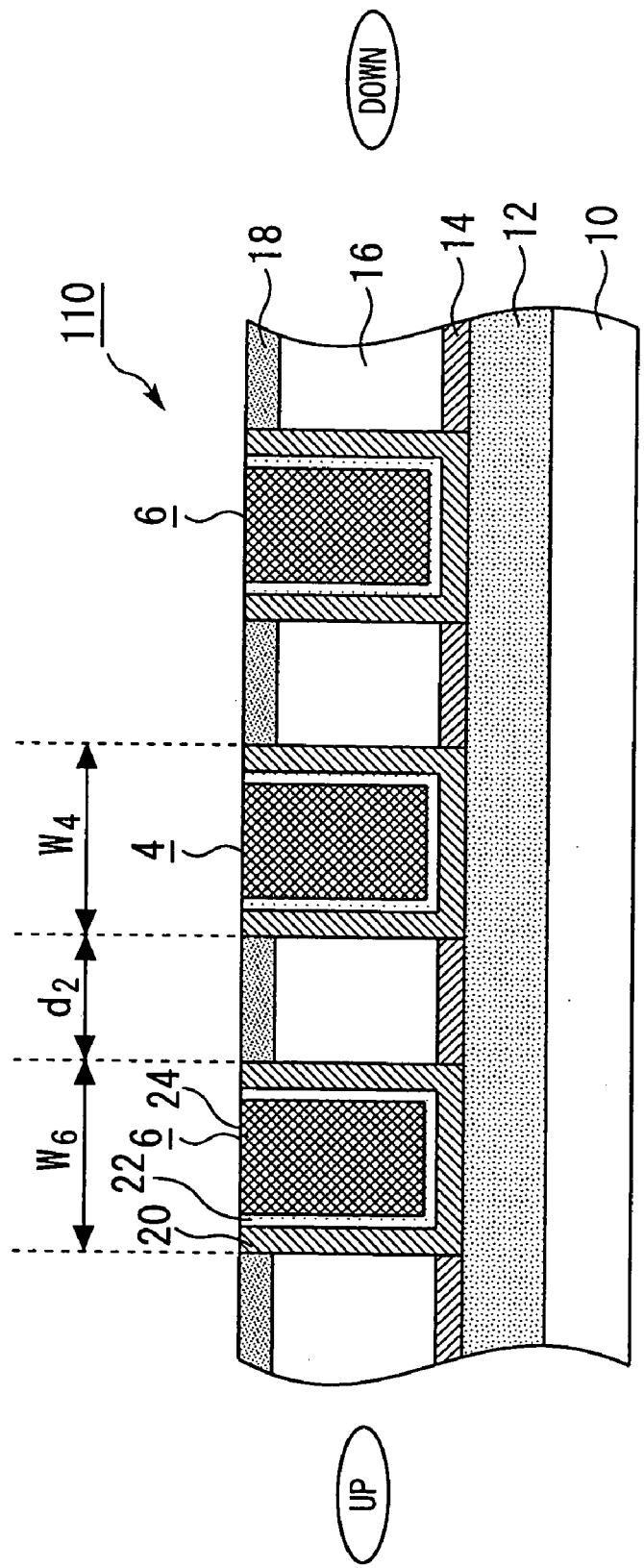

FIGS. 1 and 2 are schematic diagrams for illustrating a structure of TEG wiring according to first embodiment of the present invention. FIG. 1 illustrates the upper surface of the structure of TEG wiring; and FIG. 2 illustrates a part of the cross section of the structure of TEG wiring in the II—II direction in FIG. 1.

For simplification of description herein, as FIG. 1 illustrates, the lengthwise direction of each wiring is referred to as "right-left", and the direction perpendicular thereto is referred to as "up-down". The length of the wiring in the up-down direction is referred to as "width"; the distance between wirings adjacent to each other is referred to as "interval"; and the sum of the width-of the wiring and the interval to the adjacent wiring is referred to as "pitch".

As FIG. 1 illustrates, electrode pads 2, a wiring 4 electrically connected thereto, and dummy wirings 6 electrically isolated from the electrode pads 2 are formed in the TEG wiring 110.

The electrode pads 2 are formed on two places so as to be connected to the both ends of the wiring 4. The wiring 4 is a horseshoe-shaped wiring formed of two parallel lines 4a in the right-left direction, and a line 4b in the up-down direction connected to the right ends of these two lines 4a. The left end of each of two lines 4a in the right-left direction is connected to the electrode pad 2. The distance $d_1$ between the two lines 4a in the right-left direction is about 3 μm. The width $W_4$ of each line 4a is about 100 nm.

Several dummy wirings 6 are sequentially disposed in the up-down direction in parallel to the line 4a in the right-left direction of the wiring 4. The dummy wiring 6 are also formed in an area surrounded by the wiring 4, that is, on the area between two lines 4a in the right-left direction, and between the electrode pads 2 and the line 4b in the up-down direction. The wiring width $W_6$ equals to the width $W_4$ of the lines 4a of the wiring 4, and is about 100 nm. The total wiring pitch including the lines 4a of the wiring 4 is about 200 nm. In other words, the distance $d_2$ between the dummy wirings 6 adjacent to each other (or between the dummy wiring 6 and the lines 4a of the wiring 4) is about 100 nm.

The cross section of such a TEG wiring 110 will be described referring to FIG. 2. Although FIG. 2 illustrates the cross section in the A—A' direction in FIG. 1, for simplifying the description, only two dummy wirings 6, and a wiring 4 disposed between these two dummy wirings 6 are illustrated.

As FIG. 2 illustrates, in the TEG wiring 110, a silicon oxide film 12 is formed on a substrate 10. An insulating film 14 is formed on the silicon oxide film 12. The insulating film 14 is a film having a mechanical strength similar to the mechanical strength of the silicon oxide film 12. An SiOC-based insulating film 16 is formed on the insulating film 14. The dielectric constant of the insulating film 16 is about 2.8. Another insulating film 18 is further formed on the insulating film 16. The insulating film 18 has mechanical strength similar to the mechanical strength of the silicon oxide film 12.

The wiring 4 and the dummy wirings 6 are formed penetrating the insulating film 14, 16, and 18. On the inner wall of each of holes formed penetrating the insulating film 14, 16, and 18, a Cu seed film 22 is formed through a barrier metal film 20, and Cu 24 is further embedded therein. Although described above, both the width of a wiring 4, $W_4$, and the width of the dummy wiring 6, $W_6$, are about 100 nm; and the distance $d_2$ between the wiring 4 and the dummy wiring 6 is about 100 nm.

Figure 3:
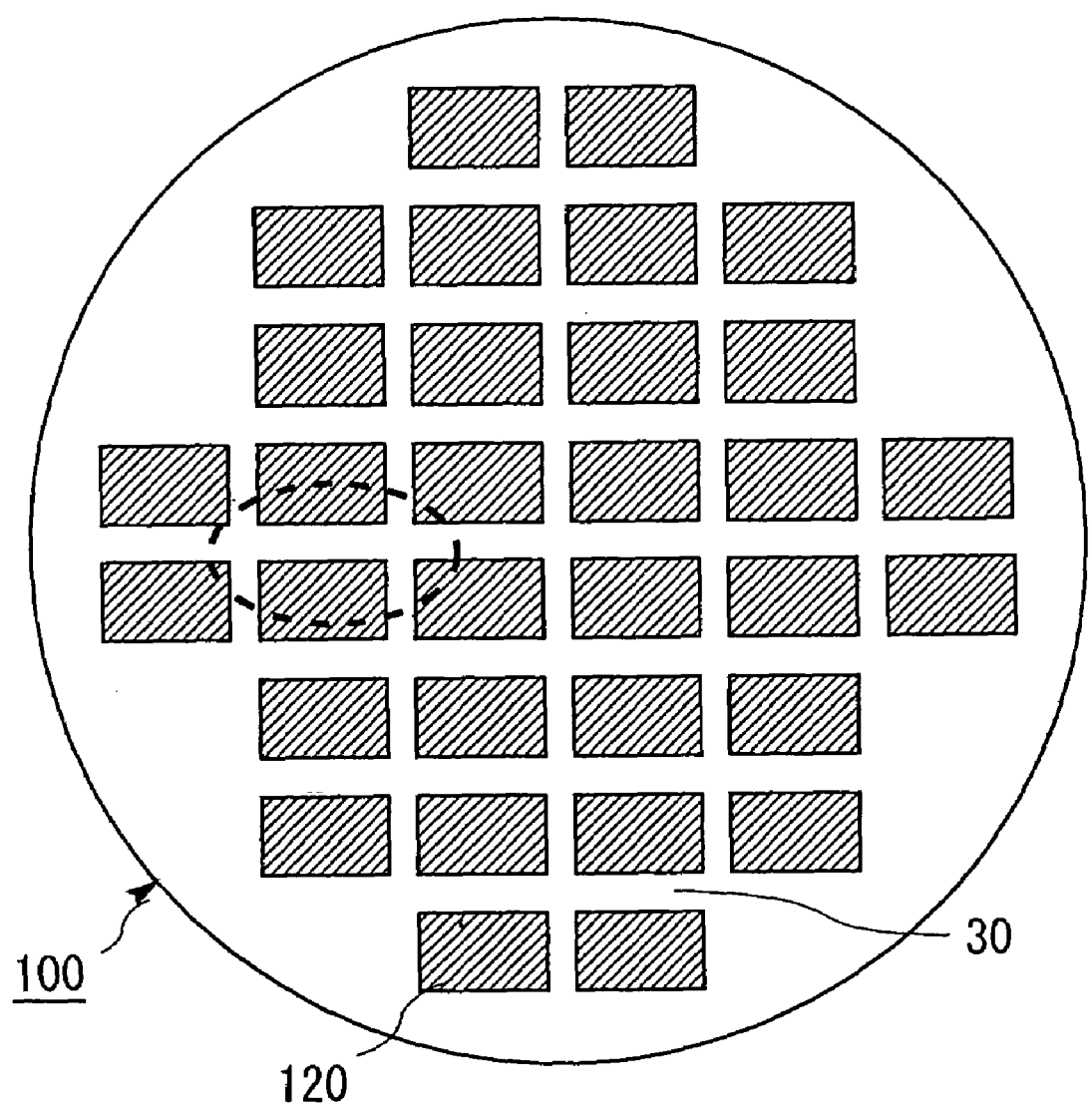
FIGS. 3 and 4 are schematic top views for illustrating a wafer having TEG wirings according to the first embodiment of the present invention.
Figure 4:
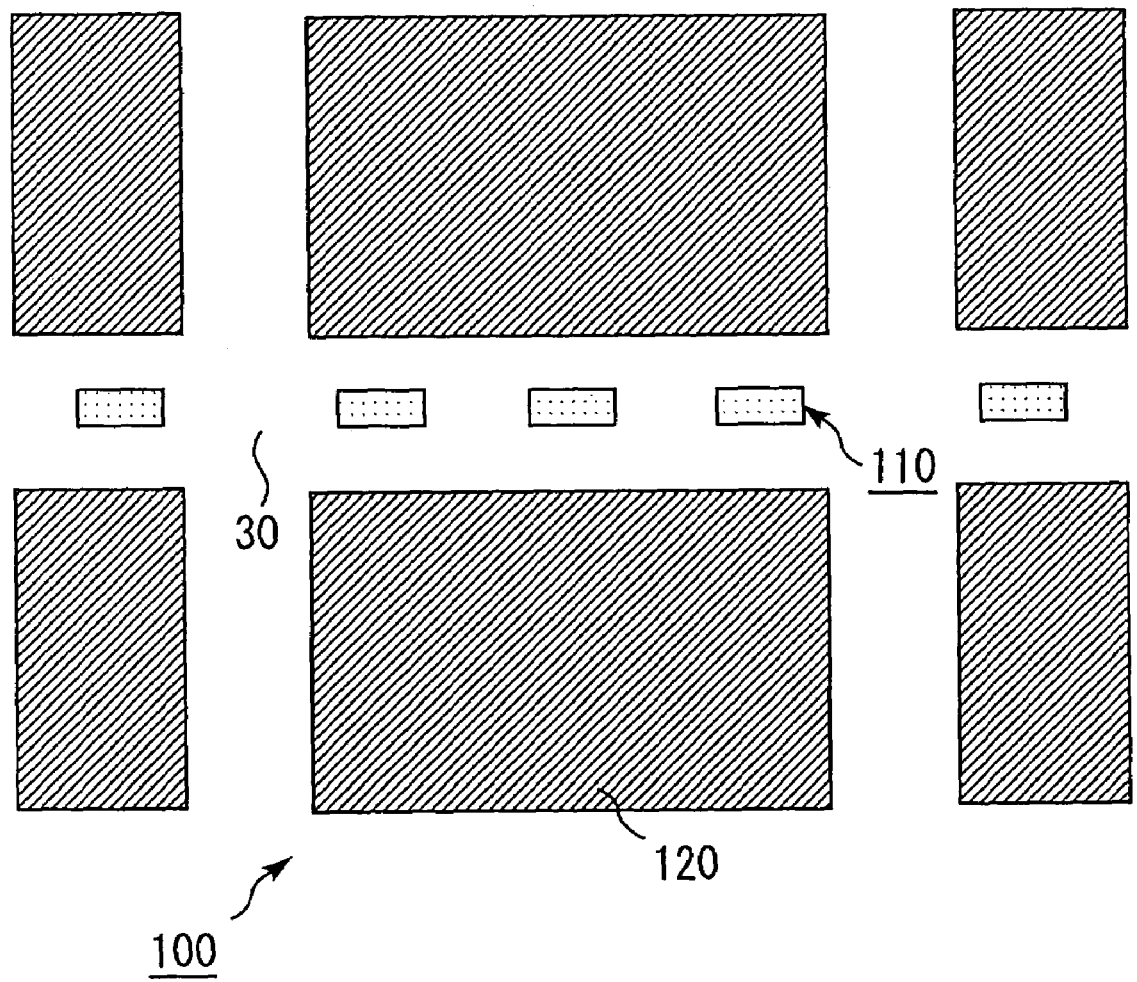

FIGS. 3 and 4 are schematic top views for illustrating a wafer 100 having TEG wirings 110 as described above formed thereon. FIG. 4 illustrates an enlarged view of the vicinity of the area surrounded by a dotted line in FIG. 3.

As FIG. 3 illustrates, the wafer 100 is divided into a plurality of regions by the scribe line region 30, and a semiconductor device 120 is formed on each region. As FIG. 4 illustrates, the TEG wirings 110 are formed in lines on the scribe line region 30 on the wafer 100.

Figure 5:
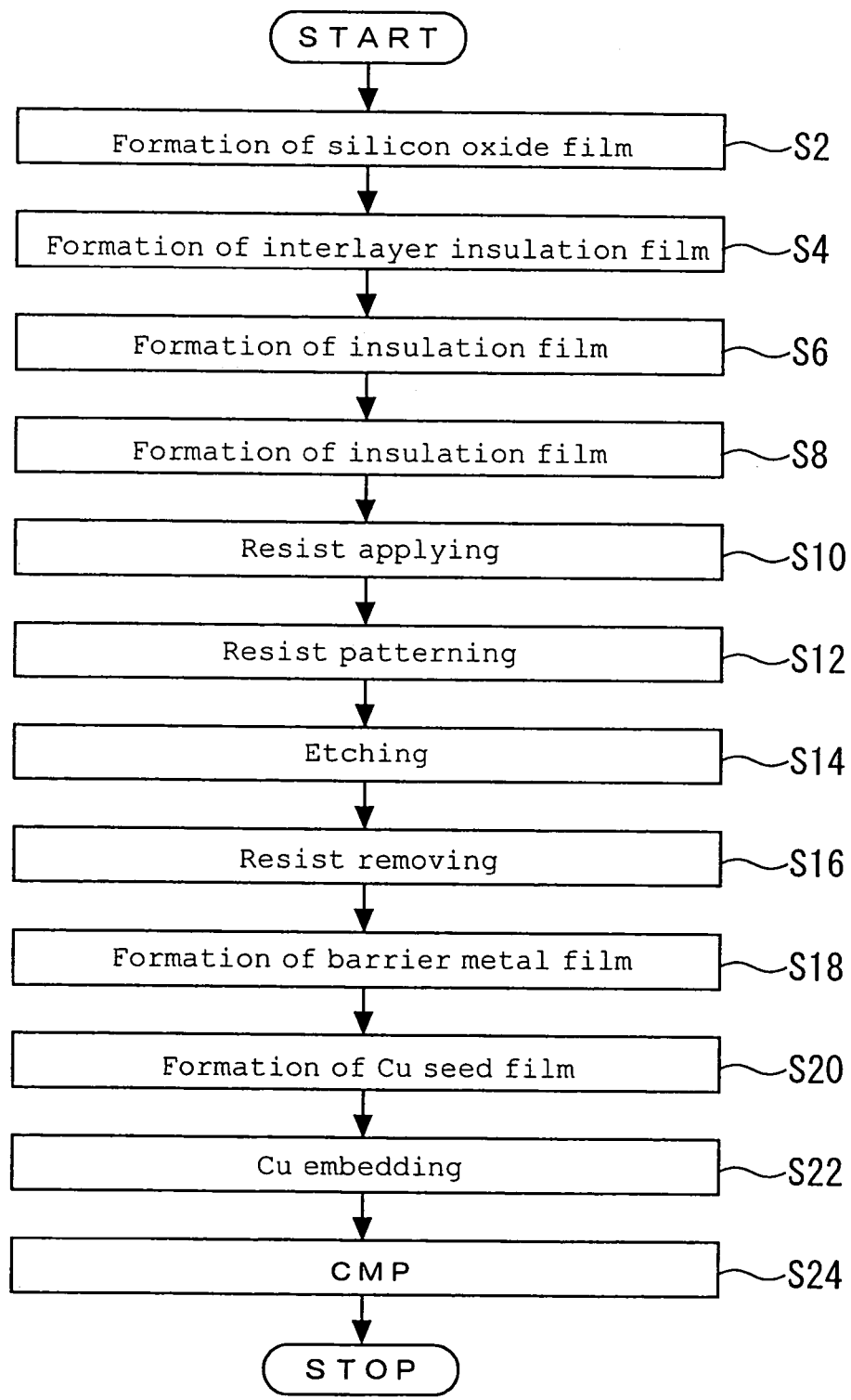
FIG. 5 is a flow diagram for illustrating a method for forming TEG wirings in the first embodiment of the present invention.

FIG. 5 is a flow diagram for illustrating a method for forming TEG wirings 110 in the first embodiment of the present invention. The method for forming the TEG wirings 110 will be described below.

First, a silicon oxide film 12 is formed using thermal oxidation on the substrate 10, specifically, at least on the scribe line region 30 of the wafer 100 (Step S2). Here, required elements have been formed on the regions of the wafer 100 for forming semiconductor devices 120. Thereafter, an insulating film 14, an insulating film 16, and-an insulating film 18 are laminated in this order using a CVD (chemical vapor deposition) method (Steps S4 to S8).

Next, holes are formed in the predetermined locations so as to penetrate the insulating film 14, 16, and 18. Here, first, a resist is applied onto the insulating film 18 (Step S10), and the resist is patterned by exposure, development and the like (Step S12).

On a reticule used in the exposure, patterns corresponding to the TEG wirings 110 and patterns corresponding to the patterns required in semiconductor devices 120 are formed.

On each region of the wafer 100 divided by the scribe line region 30, only patterns corresponding to the patterns of the semiconductor devices 120 are used and exposed. As required, specifically in the first embodiment, when both the scribe line region 30 and region divided by the scribe line region 30 are exposed, the entire surface of the pattern of the reticule including the patterns corresponding to the TEG wirings 110 and the patterns of the semiconductor devices 120 is used.

Particularly in a TEG wiring 110, the dummy wirings 6 of the same shape as the lines 4a of the wirings 4 are formed at a constant distance between the lines 4a of a wiring 4 connected to the pads 2. Therefore, since the data rate on the mask pattern is equalized, the pattern of the TEG wiring for defect analysis can be precisely transferred in this exposure.

Thereafter, the insulating film 18, 16, and 14 are etched using the patterned resist as a mask to form holes penetrating the insulating films 14 to 18 (Step S14). The resist is removed after the formation of the holes (Step S16).

Next, TaN and Ta films are formed as a barrier metal film 20 using a PVD (physical vapor deposition) method (Step S18), and a Cu seed film 22 is formed thereon as a seed film for electrolytic plating using a PVD method (Step S20). Then, Cu 24 is embedded using an electrolytic plating method (Step S22). Thereafter, planarization is performed using a CMP (chemical mechanical polishing) method (Step S24).

As described above, the patterns of the TEG wirings 110 and the semiconductor devices 120 are formed on the wafer 100.

Next, a method for testing patterns using the TEG wirings 110 formed as described above will be described.

Figure 6:
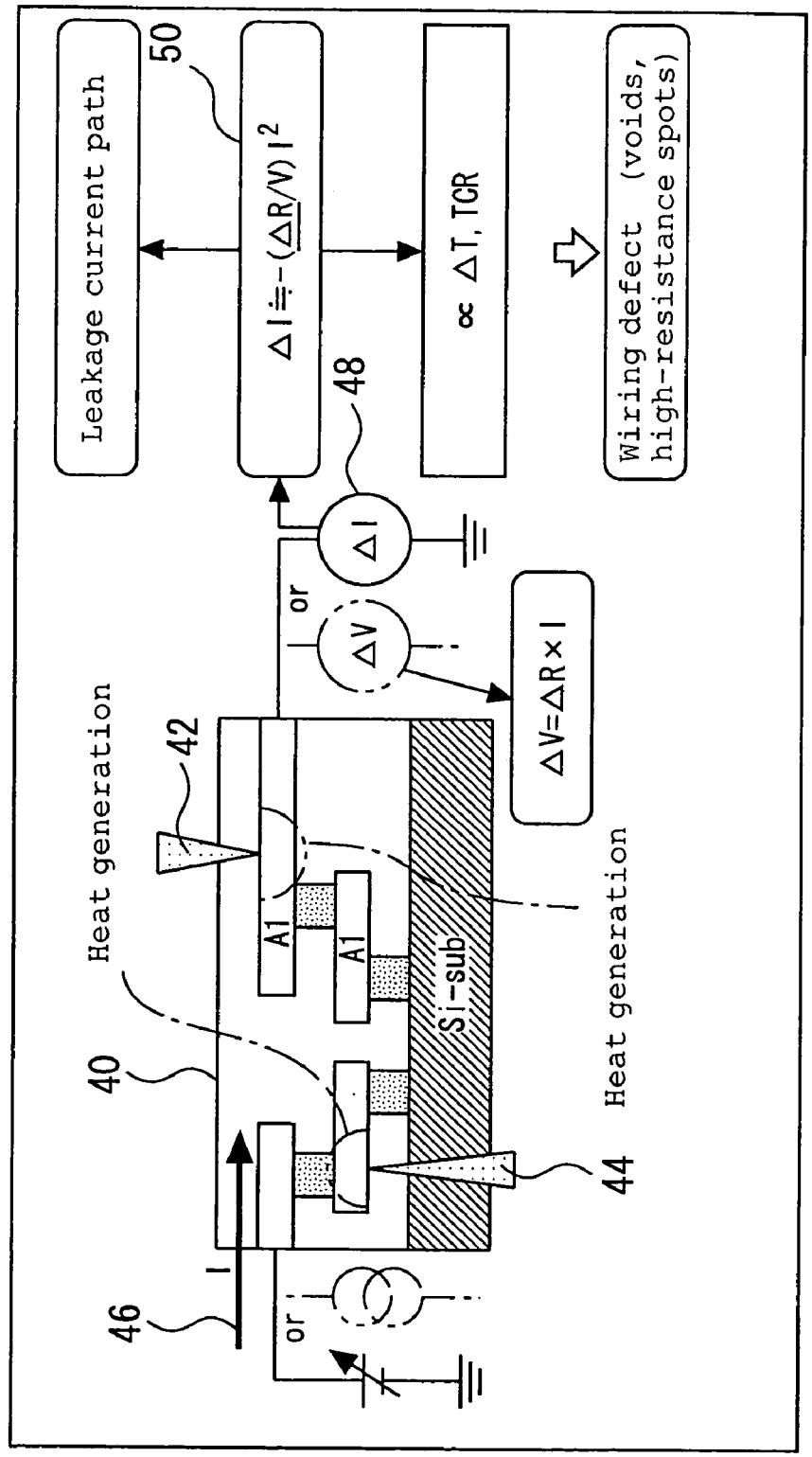
FIG. 6 is a schematic diagram for illustrating the OBIRCH method carried out using the TEG wirings according to the first embodiment of the present invention.

FIG. 6 is a schematic diagram for illustrating the OBIRCH method carried out using the TEG wirings 110.

The testing apparatus used in the OBIRCH method can radiate laser beams 42 from the top face of the test sample 40, or laser beams 44 from the back face of the test sample 40. The testing apparatus can also supply a current 46 to the required portion of the test sample 40. The current flowing through the test sample 40 is detected by a high-sensitivity amplifier 48. The current data detected by the high-sensitivity amplifier 48 is transmitted to the variable current image acquiring-portion 50, and the image of the current is acquired from the data.

Specifically, the case wherein the above-described TEG wirings 110 are used for the pattern test as the test sample 40 will be described. First, a bias voltage is applied to a pad 2, and a current 46 is flowed through the wiring 4. Here, when the current 46 flows, laser beams 42 of a wavelength of about 1.3 μm is radiated on the wiring 4. The irradiated point generates heat slightly.

The heat changes the resistance of the wiring 4 slightly. The variable current (OBIRCH current) is detected by the high-sensitivity amplifier 48 connected to another pad 2. By detecting the OBIRCH current synchronizing laser scanning, a two-dimensional variable current image (OBIRCH image) of the wiring 4 can be acquired by the variable current image acquiring portion 50.

For example, if defect such as a void or deposited Si is present in the wiring 4, heat dissipation is hard to occur compared to normal portions. Therefore, temperature rise ΔT due to laser-beam radiation differs depending on the presence or absence of defect. Since the temperature rise is large at the portion where defect is present, change in wiring resistance in this portion increases. Therefore, the OBIRCH image is contrasted enabling the defective portion to be identified. Current variation may also occur due to difference in the temperature coefficient (TCR). Especially when a high-resistance alloy such as transition metals is present, the TCR has a negative value, and the resistance decreases due to temperature rise to flow the current easily. Thereby, the high-resistance portion can also be identified.

Here, since no current variation occurs even if laser beams 42 is radiated to the area not related to the current path, namely the dummy wirings 6, the current path can be identified by identifying the OBIRCH image and the reflected pattern image. However, in the case when defect is present, such as the case when the dummy wiring 6 and the wiring 4 are short-circuited due to defect in the shape or the like, since the resistance of the wiring 4 varies, the portion can be detected as defective.

Thereby, the defect of the TEG wirings 110 can be analyzed.

As described above, in the TEG wiring 110 for defect analysis in the first embodiment, the dummy wirings 6 are formed between the lines 4a of the wiring 4 connected to the pads 2. In this structure, the distance $d_1$ between the lines 4a of the wiring 4 parallel in the right-left direction is about 3 μm. The dummy wirings 6 are formed between the lines 4a of the wiring 4 parallel in the right-left direction in the same width $W_4$ ($W_6$) as the wiring 4 and in the same pitch. Specifically, in the TEG wiring 110, the distance between the lines 4a of the wiring 4 connected to the pads 2 is secured to be 3 μm or more, the entire TEG wiring including the dummy wirings 6 becomes fine dense pattern, and the pattern density is adjusted to be substantially constant. Thereby, the TEG wiring having a fine wiring pitch and having a symmetrical pattern to some extent corresponding to the pattern of increasingly miniaturized semiconductor device, and enabling the defective portion analysis by the OBIRCH method can be realized.

In the first embodiment, the case wherein a TEG wiring 110 is formed in the scribe-line region 30 of a wafer 100 is described. This is for avoiding waste to secure the space for forming the TEG wiring 110 that is not actually used as the wiring or the like of a semiconductor chip, and for using the entire surface of the wafer 100 usefully. However, in the present invention, the TEG wiring 110 is not limited to that formed in the scribe-line region 30, and may be formed in other areas as required.

In the first embodiment, the case wherein the lines 4a of wiring 4, in the right-left direction, having a width $W_4$ of about 100 nm and a distance $d_1$ of about 3 μm are formed and wherein the dummy wirings 6 each having the same width of $W_6$ (about 100 nm) are formed at the same pitch (about 200 nm) in the parallel with lines 4a in right-left direction is described. However, the present invention is not limited thereto, but an appropriate number of the dummy wirings 6 each having an appropriate width at an appropriate interval may be used, considering, for example, OPC for suppressing the optical proximity effect, flare caused by an ultra resolving technique, or the like. The distance $d_1$ between the lines 4a of the wiring 4 is preferably secured to have about 3 μm or more. However, the present invention is not limited thereto, but the distance may be smaller as long as the resolution of the OBIRCH method is considered.

In the first embodiment, the case wherein the wiring 4 has a horseshoe-shape is described. However, the present invention is not limited thereto, but the wiring 4 may have other shapes, as long as the distance between lines extending in parallel is appropriately secured. The dummy wirings can be disposed at an appropriate pitch so as to solve the problem of density difference between wirings having an appropriate distance with each other.

In the first embodiment, the case wherein the wiring 4 and the dummy wirings 6 are formed in insulating films 14 to 18 is described. However, the structure of the TEG wiring in the present invention is not limited thereto. For example, the wirings may be formed in a layer of insulating film. Each of wirings 4 and 6 may also have a structure wherein wirings formed separately to two or more insulating films are connected with vias or the like to form a wiring. The method for forming the TEG wiring 110 is not limited to the method described in the first embodiment, but any appropriate methods within the scope of the present invention can be used depending on the structure or the films to be used.

In the first embodiment, the defect analysis using the OBIRCH method is described. However, the present invention is not limited thereto, but the defect analysis can be performed by other methods using the TEG wiring 110. The OBIRCH method is also not limited to the case wherein laser beams 42 are radiated from the top surface as described in the first embodiment, but the radiation of laser beams from the back surface 44 can also be considered.

In FIG. 2, for the simplification of description, only a layer of silicon oxide film 12 is shown on the substrate 10. However, the present invention is not limited thereto, but it suffices if at least the substrate 10 is electrically insulated from the wiring 4. Therefore, for example, a multi-layer wiring structure wherein a plurality of insulating films are formed as required on an Si substrate 10, and vias, plugs (not shown) and the like are formed thereon, can also be used.

In the first embodiment, although the structure of the TEG wiring 110 is described, since this wiring structure has a pattern shape for suppressing the flare effect and the optical proximity effect, it can be effectively used as the wiring pattern of ordinary semiconductor devices.

Second Embodiment

Figure 7:
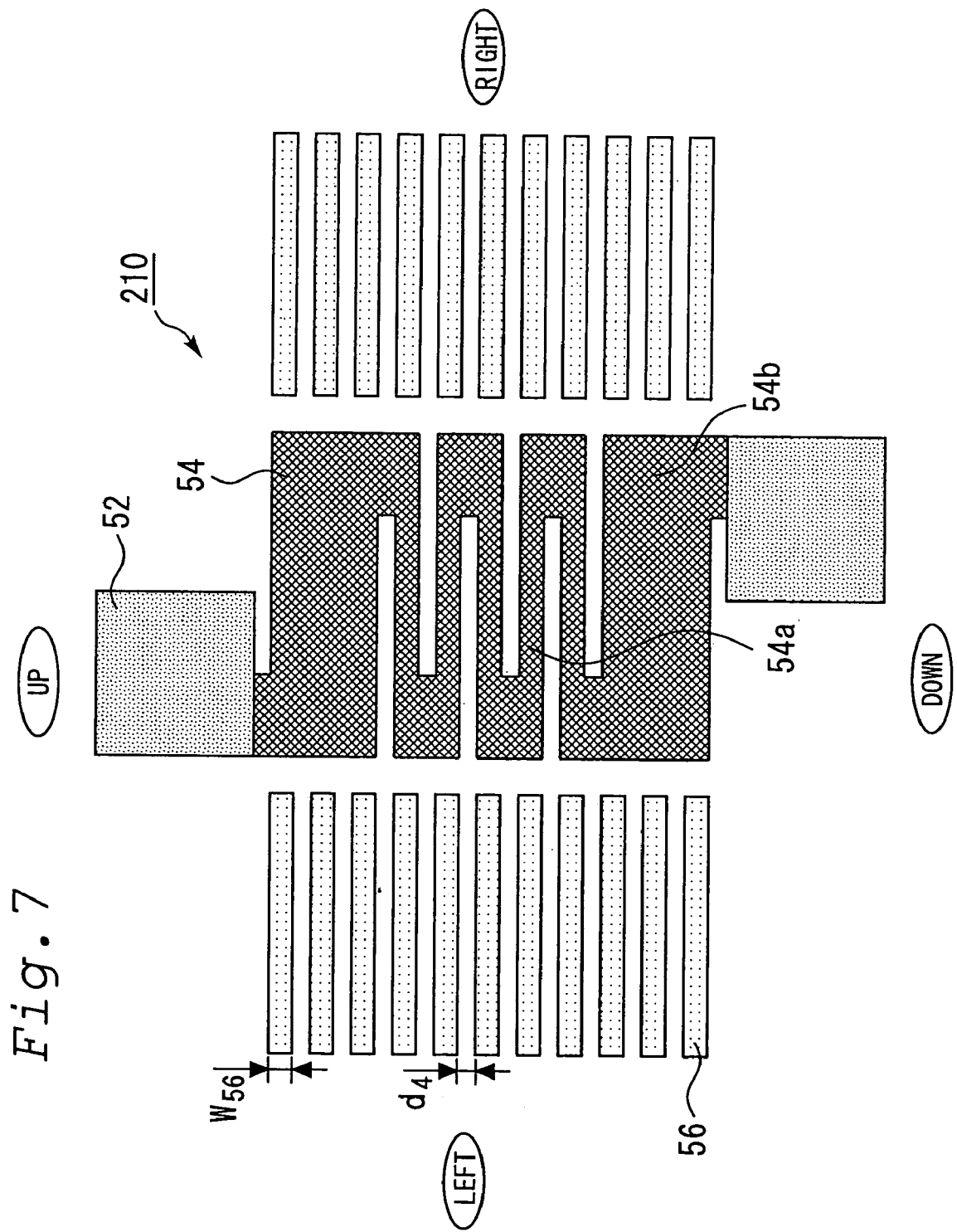
FIG. 7 is a schematic top view for illustrating the TEG wiring in the second embodiment of the present invention.

FIG. 7 is a schematic top view for illustrating the TEG wiring 210 in the second embodiment of the present invention.

As FIG. 7 shows, in the TEG wiring 210, pads 52 and a wiring 54 connected to the pads 52 are formed. On the both sides of the wiring 54, (in the right-left direction in FIG. 7), dummy wirings 56 are formed.

One of the pads 52 is disposed up, the other is disposed down; and the ends of the wiring 54 are connected to the respective pads 52. The wiring 54 is composed of lines 54a parallel to the right-left direction, and lines 54b connecting the lines 54b in the up-down direction, replicating and extending in the up-down direction. Although the width $W_{54a}$ of the lines 54a of the wiring 54 in the right-left direction is not constant, the minimum width of the wiring is about 100 nm, and the thicker portions have the integral multiples thereof.

A plurality of dummy wirings 56 are disposed in the right and left spaces of the wiring 54 in parallel to the right-left direction at the same pitch in the up-down direction. The width $W_{56}$ of the dummy wirings 56 is about 100 nm, and the distance $d_4$ between the dummy wirings 56 adjacent to each other is about 100 nm. The width $W_{56}$ of the dummy wirings 56 in the right-left direction is identical to the minimum width of the lines 54a in the right-left direction.

Thus, the shape of the wiring 54 connected to the pads 52 is substantially the same as the shape of the dummy wirings 56 as a whole. Specifically, although the width $W_{54a}$ of the lines 54a is different from the width $W_{56}$ of the dummy wirings 56, the minimum pitch of the lines 54a is identical with the minimum pitch of the dummy wirings 56, and they are disposed over substantially the same length range in the up-down direction. The length of the lines 54a in the right-left direction is substantially the same as the length of the dummy wirings 56 in the right-left direction. In other words, the data rate of the TEG wiring is adjusted to be substantially constant, and has a bilaterally symmetrical pattern shape.

Figure 8:
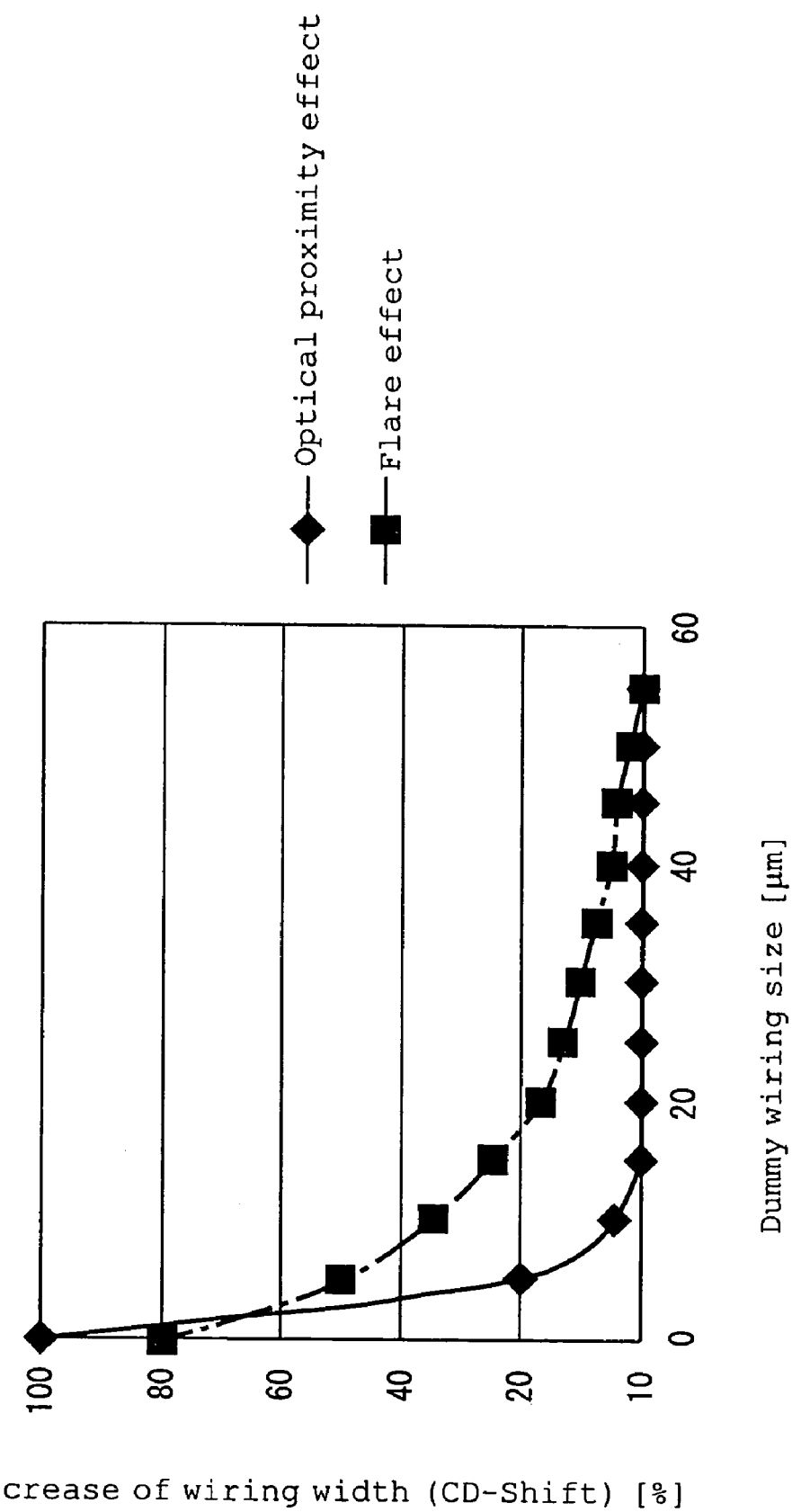
FIG. 8 is a graph for illustrating the dependency of decrease in the wiring width due to the optical proximity effect and decrease in the wiring width due to the flare effect on the width of dummy wirings.

FIG. 8 is a graph for illustrating the dependency of decrease in the wiring width due to the optical proximity effect and decrease in the wiring width due to the flare effect on the width of dummy wirings. The abscissa indicates the width of dummy wirings (μm), and the ordinate indicates decrease in the critical dimension of wiring (%).

It is seen from FIG. 8 that the tendency of pattern narrowing due to the optical proximity effect is larger when the size of the dummy wirings is smaller, while the tendency of pattern narrowing due to the flare effect is observed even when the size of the dummy wirings is 50 μm or less. Therefore, in order to prevent the inaccuracy of the wiring shape due to the optical proximity effect and the flare effect, the protective wiring size of about 50 μm is adopted in the second embodiment.

The TEG wiring 210 can be formed in the scribe-line region or the like of the wafer 100 in the same manner as in the first embodiment. The forming method and the method for defect analysis using the TEG wiring 210 are same as in the first embodiment.

In the second embodiment, as described above, the dummy wirings 56 are formed on the both sides of the wiring 54 connected to the pads 52. Thereby, the optical proximity effect and the flare effect can be suppressed, and the TEG wiring 210 can be formed.

Figure 9:
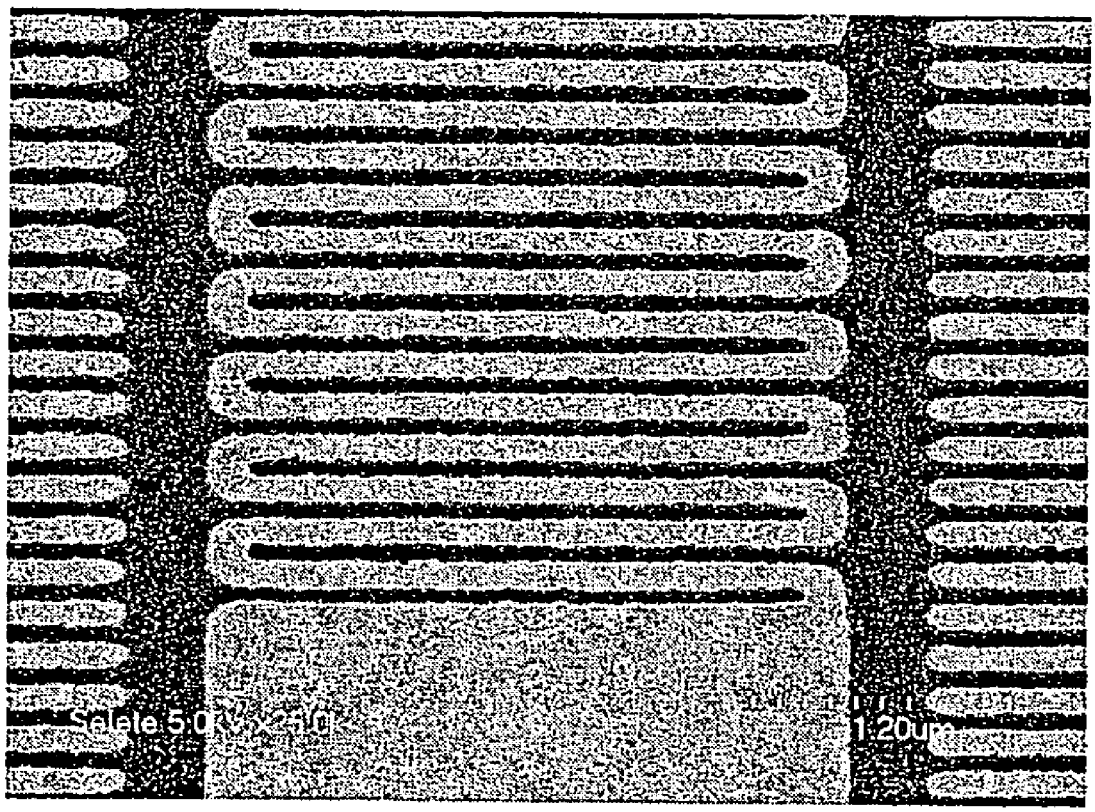
FIG. 9 illustrates an SEM photo of the surface of a TEG wiring according to second embodiment of the present invention.

FIG. 9 illustrates an SEM photo of the surface of a TEG wiring 210. The shape and the wiring width $W_{54}$ of the TEG wiring 210 are substantially agreed with the design size, and the wiring width in the wafer surface is also 100±50 nm. Thereby, it was confirmed that the TEG pattern of imprecise shape due to the optical proximity effect and the flare effect are not formed.

Also in the second embodiment, the dummy wirings is electrically isolated from the pads 52. Therefore, the circuit used for the defect analysis using the OBIRCH method is the wiring 54 connected to the pads 52. Therefore, while realizing fine wiring pattern, the TEG wiring 210 that can perform the OBIRCH method can be secured.

Here, although the shape of the TEG wiring 210 is described, since the wiring shape in the second embodiment is a pattern shape that suppresses the flare effect and the optical proximity effect, it can also be effectively used as the wiring pattern of ordinary semiconductor devices.

In the second embodiment, the case wherein the TEG wiring 210 is formed in the scribe-line region of the substrate in the same manner as in the first embodiment is described. However, the present invention is not limited thereto, and the TEG wiring 210 can be formed in the required location as required.

Since other parts are the same as in the first embodiment, the description thereof will be omitted.

Third Embodiment

Figure 10:
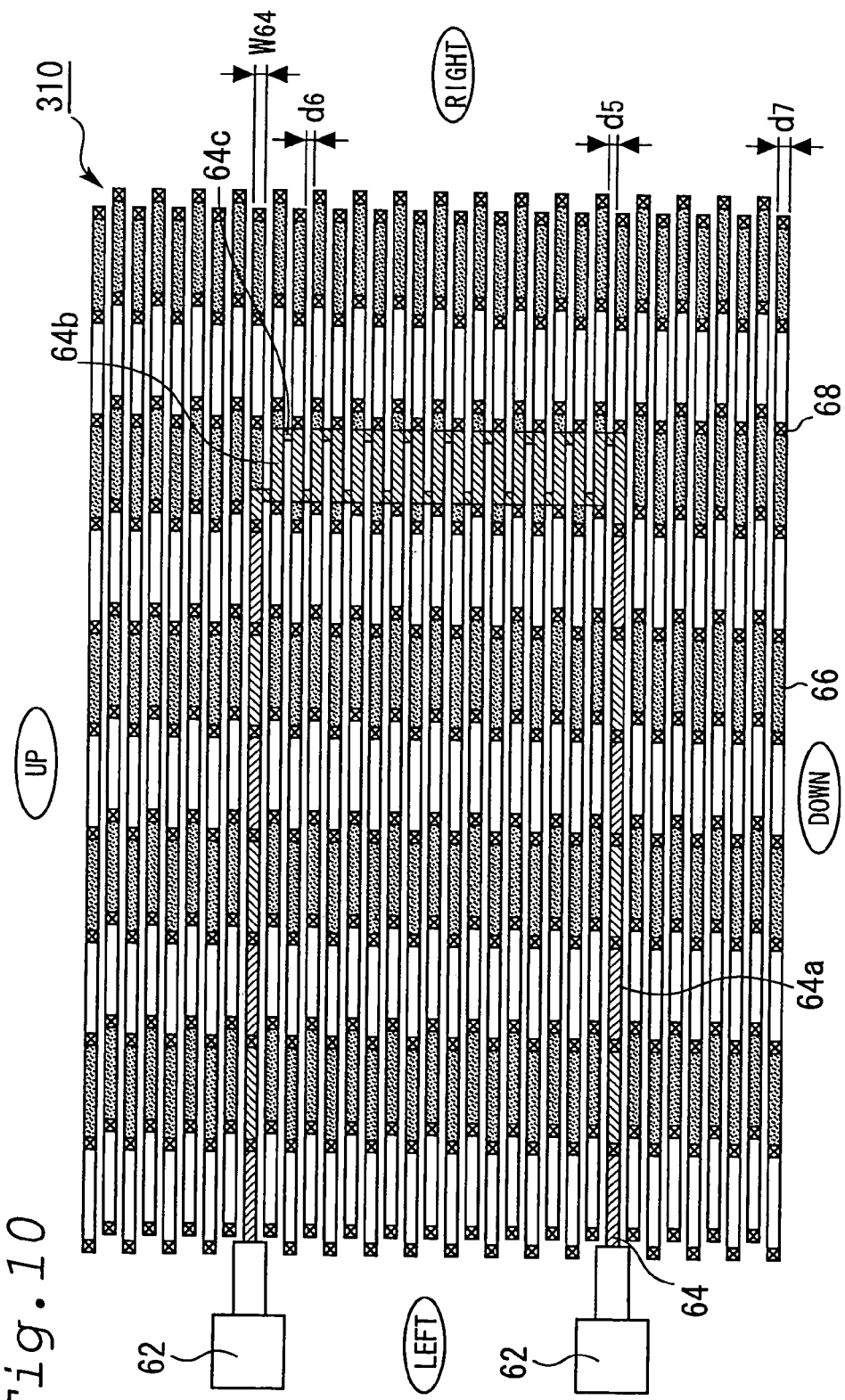
FIGS. 10 to 12 are schematic top views for illustrating the TEG wiring in the third embodiment of the present invention.
Figure 11:
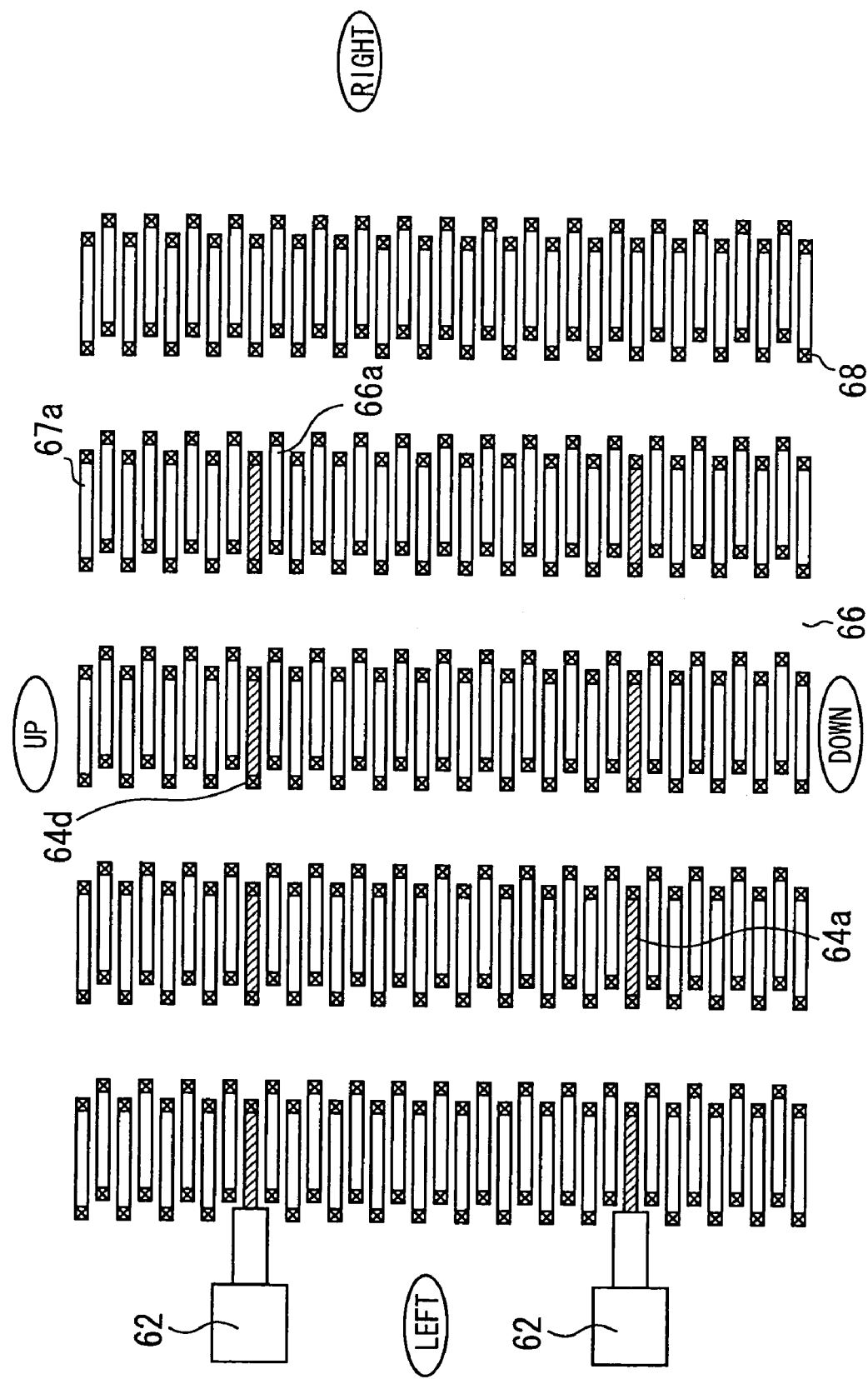
Figure 12:
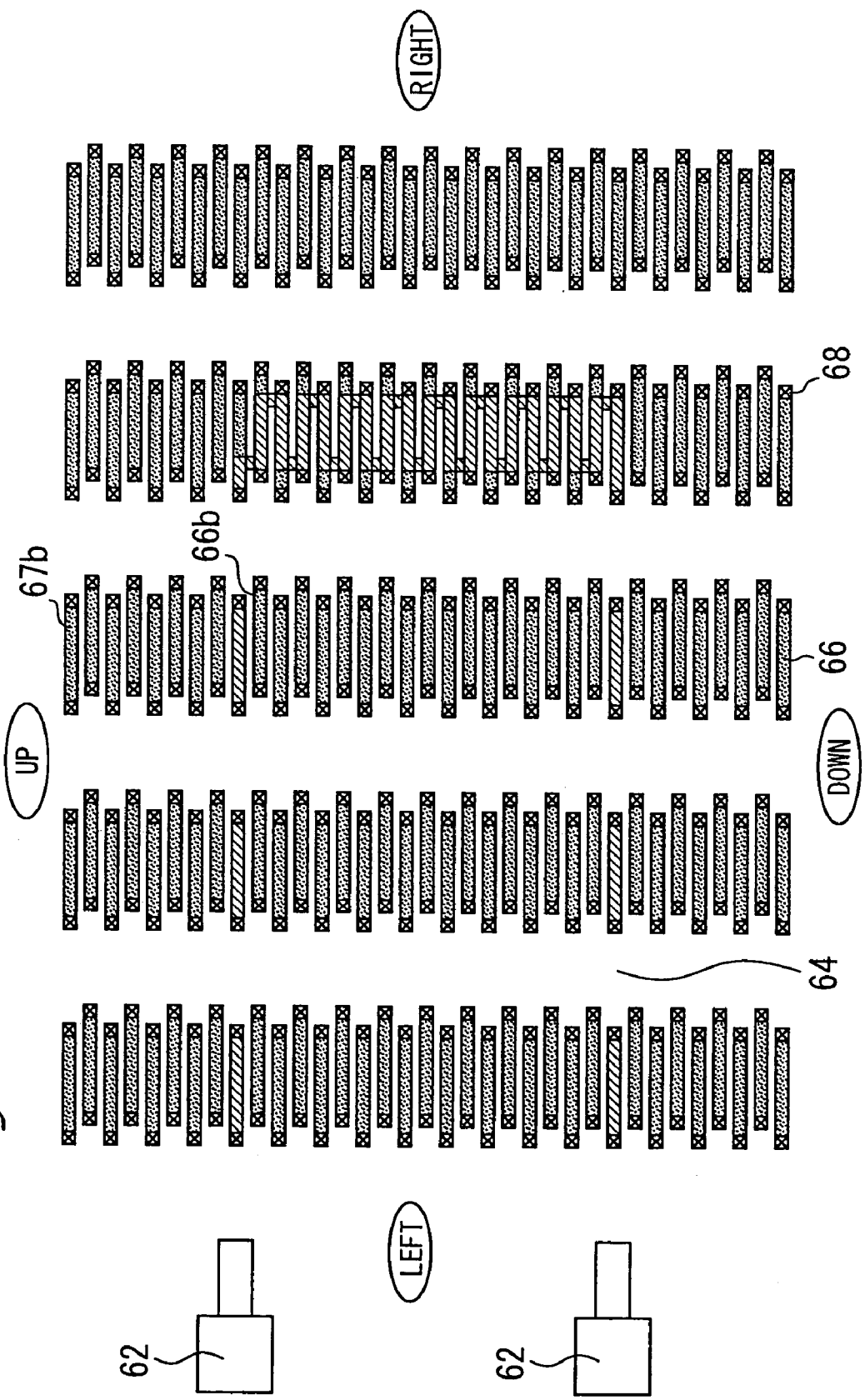

FIGS. 10 to 12 are schematic top views for illustrating the TEG wiring in the third embodiment of the present invention. FIG. 10 illustrates structure of TEG wiring formed over an upper layer and a lower layer. FIG. 11 illustrates the lower layer (M1 layer) and FIG. 12 illustrates the upper layer (M2 layer).

As FIG. 10 illustrates, the TEG wiring 310 has the structure such as the TEG wiring 110 in the first embodiment and the TEG wiring 210 in the second embodiment are combined. The TEG wiring 310 is a via-chain resistance-extracting TEG having the wiring width of 100 nm and the wiring pitch of 200 nm adopted for the defect analysis using the OBIRCH method as in the first and second embodiments. The third embodiment will be described below in further detail.

As FIG. 10 illustrates, in the TEG wiring 310, the both ends of the wiring 64 are connected to the pads 62. The wiring 64 is composed of two long parallel lines 64a connected to the pads 62 and long extending in the right-left direction, and a meandering wiring portion connected to these lines replicating and extending in the up-down direction. Further specifically, the meandering wiring portion has a plurality of lines 64b disposed in parallel in the right-left direction in the area between the two long lines 64a, and lines 64c alternately connecting the ends of the adjacent lines 64b in the up-down direction. The distance $d_5$ of the two lines 64a connected to the pads 62 of the wiring 64 is about 3 µm. The width $W_{64}$ of each of lines 64a and 64b of the wiring 64 in the up-down direction is about 100 nm. The wiring pitch of the lines 64a and 64b is 200 nm, that is, the distance between lines adjacent to each other is 100 nm. The wiring distance $d_6$ between lines 64c in the replicating portion in the right-left direction is about 100 nm.

In the area inside the horseshoe shape of the wiring 64, composed of the two lines 64a connected to the pads 62 and the meandering wiring portion, inner dummy wirings 66 are formed. In the area not sandwiched by the lines 64a and the left of the meandering wiring portion, that is, in the area outside the horseshoe shape of the wiring 64, outer dummy wirings 67 are formed. The width $W_{66}$ of the inner dummy wirings 66 and the width $W_{67}$ of the outer dummy wirings 67 in the up-down direction is both about 100 nm, and the distance $d_7$ between the dummy wirings adjacent to each other, or between the dummy wiring 66 or 67 and the wiring 64 adjacent thereto is about 100 nm.

As FIGS. 11 and 12 illustrate, each of the wiring 64 and dummy wirings 66 and 67 is composed as a wiring by connecting the wiring formed in the M1 layer to the wiring formed in the M2 layer on the M1 layer with a via 68 at predetermined points.

Specifically, as FIG. 11 illustrates, in the M1 layer, the wiring 64d and the dummy wiring 66a and 67a have the width of 100 nm, the length of 400 nm and are disposed in the several columns having the predetermined distance each other in light-left direction, wherein the distance of the adjacent wirings is 100 nm in the up-down direction in the each column.

As FIG. 12 illustrates, in M2 layer, the wirings 64e and the dummy wirings 66b and 67b, have the width of 100 nm, the length of 400 nm, and are disposed in the several columns having predetermined distance each other in light-left direction, wherein the distance of the adjacent wirings is 100 nm in the up-down direction in the each column.

Each of the wiring 64 and dummy wirings 66 and 67 is composed as a wiring by connecting the wiring 64d, 66a and 67a formed in the M1 layer to the wiring 64e, 66b and 67a formed in the M2 layer on the M1 layer with a via 68 at predetermined points.

Such a TEG wiring 310 can be formed in an appropriate location such as the scribe-line region of the wafer as required in the same manner as in the first and second embodiments. The forming method is the same as the method described in the first embodiment. The method for defect analysis by the OBIRCH method using the TEG wiring 310 is also the same as the method described in the first embodiment.

In the TEG wiring 310 of the third embodiment, as described above, wirings including the wiring 64 connected to the pads 62 and the dummy wirings 66 and 67 are formed at a constant pitch (about 200 nm) in the right-left direction. Protective wirings of a length of 50 µm are formed outside the wirings 54 connected to the pads. Therefore, the pattern can be formed considering the decrease in the wiring width due to the optical proximity effect and the flare effect.

Especially in the TEG wiring 310 of the third embodiment, dummy wirings are formed not only as the inner dummy wirings 66 formed in the area surrounded by the wiring 64, but as the outer dummy wirings 67 at the same pitch outside the wiring 64 within some extent. Here, the data rate is uniformed by the inner dummy wirings 66, and at the same time, the outer dummy wirings 67 of the same shape are disposed to suppress local flare more effectively. In other words, by disposing the outer dummy wirings 67 of the same shape outside the wiring 64, as well as the inner dummy wirings 66 inside the wiring 64, both the optical proximity effect and the flare effect can be effectively suppressed, and a TEG wiring having an accurate pattern can be formed.

By thus forming the pattern, since the distance $d_5$ between the wiring 64 actually connected to the pads 62 is about 3 µm, defect analysis can be performed using the OBIRCH method. Therefore, the accurate defect analysis using the OBIRCH method can be performed for the fine pitch dense pattern.

By making the wiring rate uniform, resistance to the CMP process can be raised. Therefore, a TEG wiring having sufficiently high reliability can be formed.

Figure 13:
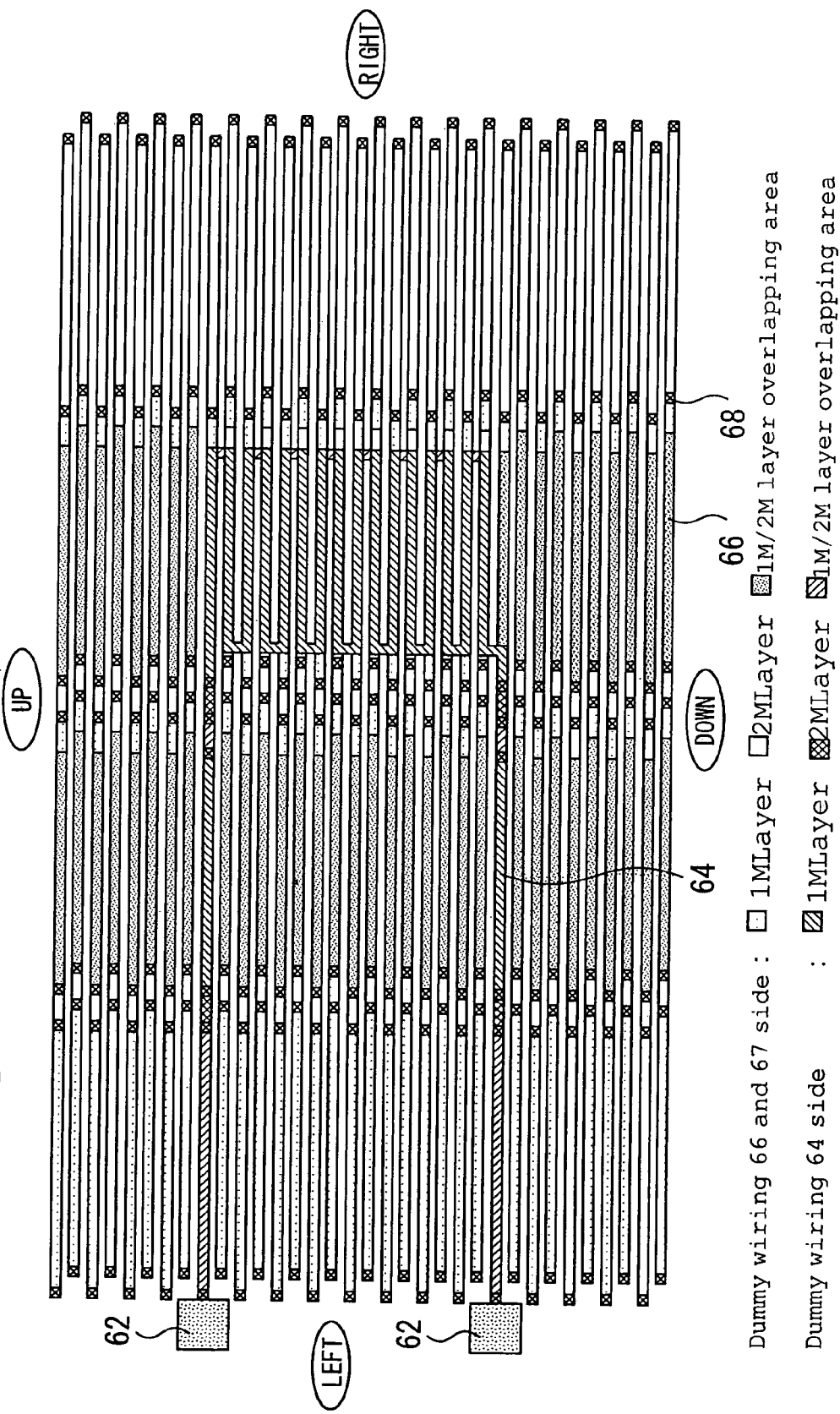
FIG. 13 is a schematic top view for illustrating another TEG wiring in the third embodiment of the present invention.

FIG. 13 is a schematic top view for illustrating another TEG wiring in the third embodiment of the present invention.

The present invention is not limited to the TEG wiring as FIG. 10 illustrates, may be adopted the TEG wiring of other wiring length and the like such as FIG. 13 illustrates.

In the third embodiment, a wiring structure of the TEG wiring 310 is described. However, such a wiring structure is effective as the wiring structure normally formed in a semiconductor chip, such as a Cu/Low-k film multilayer wiring structure.

Other parts are the same as in the first and second embodiments.

For example, the wafer 100 in the first embodiment falls under the substrate in the present invention, the pads 2, 52 and 62 in the first to third embodiments fall under the electrodes in the present invention, the wirings 4, 54 and 64 fall under the real wiring in the present invention, and dummy wirings 6, 56 and 66,67 fall under the dummy wirings in the present invention. In the present invention, a predetermined distance means the distance between a dummy wiring and another dummy wiring (or real wiring) adjacent to the dummy wiring, for example, $d_2$, $d_4$ and $d_7$ in the first to third embodiments. Also, for example, the lines 4a extending in the right-left direction connected to the pads 2 in the wiring 4 in the first embodiment fall under two line portions of the real wiring in the present invention, and $d_1$ and $d_5$ in the first and third embodiments fall under the distance of these portions. For example, the scribe-line region 30 in the first embodiment falls under the scribe line area in the present invention, the region divided by the scribe-line region 30 falls under the chip region in the present invention, and the semiconductor device 120 falls under the semiconductor chip in the present invention.

The features and the advantages of the present invention as described above may be summarized as follows.

According to one aspect of the present invention, the structure of TEG wiring includes dummy wirings disposed at a predetermined interval in the vicinity of the wiring connected to electrode pads. Therefore, while measuring the equalization of the pattern-data rate on the mask to some extent, the distance between wirings connected to the electrode pads can be sufficient to perform defect analysis. Therefore, even in a fine pattern, the TEG wiring structure can be formed, and the defect analysis can be accurately performed.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-430307, filed on Dec. 25, 2003 including specification, claims, drawings and summary, on which the Convention priority of the present application is based, are incorporated herein by reference in its entirety.

What is claimed is:

1. A test element group (TEG) wiring structure comprising:
    a substrate having a surface;
    at least one layer of an insulating film on the surface of said substrate;
    first and second electrodes supported by said insulating film on the surface of said substrate;
    real wiring supported by said insulating film on the surface of said substrate and including first and second substantially parallel linear portions spaced apart from each other and respectively electrically connected to said first and second electrodes; and
    a plurality of dummy wirings supported by said insulating film on the surface of said substrate, electrically isolated from said first and second electrodes and said real wiring, disposed between and spaced from said first and second linear portions of said real wiring, spaced from each other and from said first and second linear portions of said real wiring at a uniform interval, and having a shape that is the same shape as said first and second linear portions of said real wiring.

2. The TEG wiring structure according to claim 1, wherein said dummy wirings include inner dummy wirings disposed inside an area bounded by said first and second linear portions of said real wiring, and including outer dummy wirings supported by said insulating film on the surface of said substrate and not between said first and second linear portions of said real wiring, said outer dummy wirings being substantially parallel to said first and second linear portions of said real wiring and spaced from said first and second linear portions of said real wiring by the uniform interval.

3. The TEG wiring structure according to claim 2, wherein said outer dummy wirings have the same shape as said inner dummy wirings.

4. The TEG wiring structure according to claim 1, wherein separation between said first and second linear portions is at least 3 μm.

5. The TEG wiring structure according to claim 1, wherein the uniform interval is no more than 0.1 μm.

* * * * *